United States Patent [19]
DeVilbiss

[11] Patent Number: 5,818,238
[45] Date of Patent: Oct. 6, 1998

[54] APPARATUS FOR MEASURING CURRENT AND OTHER PARAMETERS OF AN ELECTORNIC DEVICE IN RESPONSE TO AN APPLIED VOLTAGE

[75] Inventor: Alan DeVilbiss, Colorado Springs, Colo.

[73] Assignee: Symetrix Corporation, Colorado Springs, Colo.

[21] Appl. No.: 616,625

[22] Filed: Mar. 15, 1996

[51] Int. Cl.$^6$ .............................. G01R 31/02; G01R 1/30; G01R 13/20
[52] U.S. Cl. .................. 324/537; 324/76.13; 324/121 R; 324/123 C
[58] Field of Search ...................................... 324/612, 537, 324/76.11, 76.12, 76.13, 88, 121 R, 123 C

[56] References Cited

U.S. PATENT DOCUMENTS

| | | | |
|---|---|---|---|
| 3,617,881 | 11/1971 | McCormick | 324/612 |
| 4,198,598 | 4/1980 | Rheinfelder | 324/121 R |
| 4,897,599 | 1/1990 | Koslar | 324/115 |
| 4,935,692 | 6/1990 | Wakasugi | 3324/123 C |
| 5,103,390 | 4/1992 | Liu | 324/123 C X |
| 5,319,303 | 6/1994 | Yamada | 323/313 |
| 5,578,935 | 11/1996 | Burns | 324/121 R |

*Primary Examiner*—Glenn W. Brown
*Attorney, Agent, or Firm*—Duft, Graziano & Forest, P.C.

[57] ABSTRACT

A first terminal of a device-under-measurement (DUM) is connected to the input of a buffer amplifier having its output applied to the inverting input of an operational amplifier through a resistor having the value "aR". A resistor having a value "R" is connected between the inverting input and ground. A second terminal of the DUM is connected to the input of a buffer amplifier having its output connected to the non-inverting input of the operational amplifier through a resistor having the value "ar". The non-inverting input is also connected to the output of a signal generator through a resistor having the value "r". The second terminal is also connected to ground through a load. An oscilloscope is connected across the outputs of the buffer amplifiers, and a computer controls the signal generator in response to a signal from the oscilloscope.

12 Claims, 2 Drawing Sheets

APPARATUS FOR MEASURING CURRENT AND OTHER PARAMETERS OF AN ELECTORNIC DEVICE IN RESPONSE TO AN APPLIED VOLTAGE

BACKGROUND OF THE INVENTION

1. Field of the Invention

The invention in general relates to apparatus for measuring electronic properties of an electronic device, and in particular apparatus for measuring the current or charge which flows through an electronic device in response to an applied voltage.

2. Statement of the Problem

It is very important in research laboratories to be able to accurately measure the current or charge that flows through an electronic device in response to an applied voltage. For example, in research laboratories that develop advanced materials, such as ferroelectrics, for use in integrated circuit capacitors, it is crucial to be able to accurately measure the electronic parameters of a large number of integrated circuit capacitors so that differences in materials can be correlated with differences in capacitance, leakage current etc. of the devices. In this disclosure we shall call a device, one or more electrical parameters of which are to be measured, as a device-under-measurement, or DUM.

The most common laboratory method of measuring the current or charge displaced within a ferroelectric device is the Sawyer-Tower circuit. In a Sawyer-Tower circuit, a voltage output by a waveform generator is applied to the input terminal of a device upon which the measurement of an electronic parameter is to be performed (DUM) and to one input of an oscilloscope. The output of the DUM is connected to another input of the oscilloscope and to ground through a load. This circuit does not properly terminate the transmission lines to the DUM, and relies on the assumption that the DUM has a constant high impedance. This assumption is not valid for non-linear materials and at high frequencies. Moreover, for almost all DUMs, there is some unknown voltage drop across the DUM, and thus the Sawyer-Tower circuit can often only provide an inadequate approximation to the true current and charge flowing through a DUM.

The above problems with the Sawyer-Tower circuit have lead to a modification of the Sawyer-Tower circuit by the addition of a virtual ground. That is, instead of being directly connected to ground, the output of the DUM is connected to the inverting input of an operational amplifier (op amp) that has its non-inverting input connected to ground and its output connected to the second input of the oscilloscope. The load is then connected between the inverting input of the operational amplifier and its output. Low speed op amps typically have low input offset currents and voltages, and thus the voltage drop across the load can accurately be related to the current/charge flowing through the DUM. However, high speed op amps typically have large input offset currents and voltages, and thus, at high frequencies, the voltage across the load is not accurately related to the current/charge flowing through the DUM. Moreover, if the DUM has a low and/or a variable impedance, the conventional virtual ground does not in and of itself yield accurate results even at low frequencies.

3. Solution to the Problem

The present invention solves the above problem by providing a measurement circuit that applies a predetermined voltage across the DUM no matter what its impedance, and at all frequencies, so long as the circuit is operated within its current compliance and bandwidth limitations. The predetermined voltage is maintained by providing feedback from the load side of the DUM to the circuit that applies the voltage to DUM. An operational amplifier is connected with its output applied to one terminal of the DUM and its non-inverting input connected to the other terminal of the DUM. A signal generator applies a voltage signal to the non-inverting input of the operational amplifier, thus causing the amplifier to apply a predetermined voltage pulses across the DUM.

The invention also permits one to select the load so that the electrical parameters across it are related to the DUM parameters in an unambiguous manner and can easily and accurately be measured. This is done by referencing the non-inverting input to ground through the load.

Put another way, the present invention provides a DUM/load circuit that is essentially independent of the signal generation circuit. Buffer amplifiers connect the DUM/load circuit to the inputs of the operational amplifier, thus preventing any current flow between the DUM/load circuit and the signal generation circuit. Thus, the signal across the DUM and the voltage drop across the load may be separately determined due to the essential independence of the signal generation circuit and the DUM/load circuit.

The invention provides a measurement circuit comprising: a first electrical terminal for connection to a device upon which the measurement of an electronic parameter is to be performed (DUM); a second electrical terminal for connection to the DUM; a load circuit having a load circuit input and a load circuit output; a signal generation circuit including an operational amplifier having a first input, a second input and an output; the second terminal connected to the load circuit input and to one of the inputs of the operational amplifier. Preferably, the output of the operational amplifier is connected to the first electrical terminal. Preferably, the measurement circuit includes a ground and the load circuit output is connected to the ground. Preferably, the first electrical terminal is connected to the output of the operational amplifier and the other of the inputs of the operational amplifier. Preferably, the first input of the operational amplifier is a non-inverting input and the second input of the operational amplifier is an inverting input, the second terminal is connected to the non-inverting input, and the first terminal is connected to the inverting input. Preferably, the measurement circuit includes a signal generator connected to the non-inverting input and an oscilloscope connected to the second terminal. Preferably, the measurement circuit further includes a first resistor connected between the inverting input and the ground, a second resistor connected between the inverting input and the second terminal, a third resistor connected between the signal generator and the non-inverting input, and a fourth resistor connected between the non-inverting input and the second terminal.

In another aspect, the invention provides a measurement circuit comprising: a DUM/load circuit; a signal generation circuit; a first buffer amplifier connected between the DUM/load circuit and the signal generator circuit, thereby preventing current flow through the connection between the DUM/load circuit and the signal generation circuit. Preferably, the signal generation circuit includes an operational amplifier having an input, the buffer amplifier incudes and input and an output, and the buffer amplifier input is connected to the DUM/load circuit and the buffer amplifier output is connected to the operational amplifier input. Preferably, the DUM/load circuit includes a first terminal for connecting to a device upon which the measurement of an electronic parameter is to be performed (DUM), a second terminal for connecting to the DUM, a load circuit including a load circuit input, the operational amplifier includes an inverting input and a non-inverting input, the second terminal is connected to the load circuit input and the buffer amplifier input, the first buffer amplifier output is connected to the non-inverting input, the circuit further including a second buffer amplifier having an input and an output, and wherein the first terminal is connected to the operational amplifier output and the operational amplifier inverting input. Preferably, the measurement circuit includes an oscilloscope connected between the output of the first buffer amplifier and the output of the second buffer amplifier. Preferably, the measurement circuit includes a ground, the signal generation circuit includes a signal generator, and the measurement circuit further including a first resistor connected between the inverting input and the ground, a second resistor connected between the output of the second buffer amplifier and the inverting input, a third resistor connected between the signal generator and the non-inverting input, and a fourth resistor connected between the output of the second buffer amplifier and the non-inverting input. Preferably there is a computer connected between the oscilloscope and the signal generator.

In a further aspect the invention provides an electrical measurement circuit comprising; a DUM/load circuit comprising terminals for connection to a device upon which an electronic measurement is to be performed (DUM) and an input for connection to a load; a signal generation circuit for applying an electrical signal to the DUM; and a feedback circuit for providing a feedback signal from the DUM/load circuit to the signal generation circuit; and the signal generation circuit includes an amplifier circuit responsive to the feedback signal for adjusting the signal applied to the DUM. Preferably, the DUM/load circuit terminals comprise a first electrical terminal for connection to the device upon which the measurement of an electronic parameter is to be performed (DUM) and a second electrical terminal for connection to the DUM, the amplifier circuit comprises an operational amplifier having a first input and an output; and the second terminal is connected to the first input of the operational amplifier and the output of the operational amplifier connected to the first terminal. Preferably, the first input comprises the non-inverting input of the operational amplifier, the operational amplifier also includes an inverting input, and the first terminal is connected to the inverting input. Preferably, the electrical measurement circuit further includes a ground, the DUM/load circuit includes a load, and the signal generation circuit includes a signal generator, the load is connected between the second electrical terminal and the ground, and the signal generator is connected to the non-inverting input. Preferably, the electrical measurement circuit further includes an oscilloscope connected to the second terminal and a computer connected to the oscilloscope and the signal generator. Preferably, the second terminal is connected to the non-inverting input and the oscilloscope through a buffer amplifier.

In yet another aspect, the invention provides an electrical measurement circuit comprising: a first electrical terminal for connection to a device upon which the measurement of an electronic parameter is to be performed (DUM); a second electrical terminal for connection to the DUM; a ground, a first resistor, a second resistor, a third resistor; and a fourth resistor; a signal generator; an operational amplifier having an inverting input, a non-inverting input, and an output; the first terminal connected to the operational amplifier output, and the first terminal also connected to the inverting input through the first resistor; the inverting input also connected to the ground through the second resistor; the signal generator connected to the non-inverting input through the third resistor; and the second terminal connected to the non-inverting input through the fourth resistor. Preferably, the electrical measurement circuit further includes a first buffer amplifier and a second buffer amplifier, the first buffer amplifier is connected between the first terminal the first resistor, and the second buffer amplifier is connected between the second terminal and the fourth resistor.

The measurement circuit according to the invention not only permits the measurement signal across the DUM to be independently selected from the signal across the load, but also does this simply and with little expense. Further, the measurement circuit according to the invention is accurate at a wide range of frequencies limited only by the frequency response of the operational amplifier. Numerous other features, objects and advantages of the invention will become apparent from the following description when read in conjunction with the accompanying drawings.

DESCRIPTION OF THE PREFERRED EMBODIMENT

Figure 1:
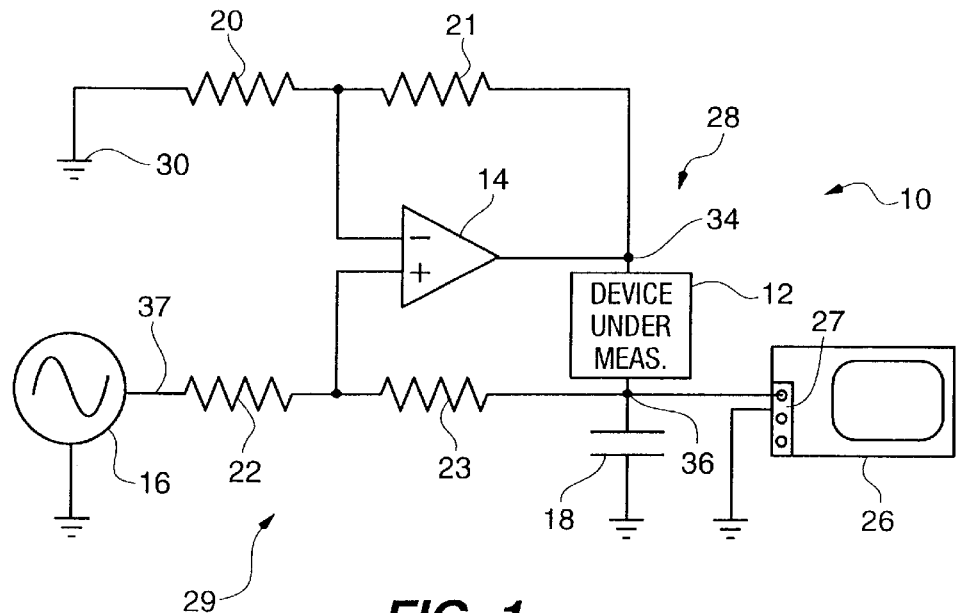
FIG. 1 shows an exemplary embodiment of a measurement circuit according to the invention.

Directing attention to FIG. 1, an exemplary measurement circuit 10 according to the invention is shown. Measurement circuit 10 includes device under measurement (DUM) 12, operational amplifier 14, signal generator 16, load capacitor 18, and resistors 20–23. Oscilloscope 26 measures the current or charge that flows into load capacitor 18 with each measurement pulse. A ground is indicated at 30. In the embodiment shown, the DUM is a two-terminal device, such as a capacitor, but it may be other electrical devices also. It should be understood that the words "electrical" and "electronic" are intended to be equivalent herein. That is, the word "electronic" herein includes everything included in both the conventional term "electronic" and also everything included in the conventional term "electrical". Likewise, the term "electrical" herein includes everything included in both the conventional term "electrical" and also everything included in the conventional term "electronic". DUM 12 includes a first terminal 34 and a second terminal 36. The output of operational amplifier 14 is connected to the first terminal 34 of DUM 12, while the second terminal 36 is connected to ground through a load 18, which in the embodiment shown is a capacitor, but may also be a resistor, a combination of a resistor or capacitor, or one or more other electronic devices. The first terminal 34 of DUM 12 is also connected to the inverting input of operational amplifier 14 through resistor 21. The inverting input of operational amplifier 14 is also connected to ground through resistor 20. The second terminal 36 of DUM 12 is also connected to the non-inverting input of operational amplifier 14 through resistor 23. The non-inverting input of operational amplifier 14 is also connected to the output 37 of signal generator 16 through resistor 22. Oscilloscope 26 is connected between the second terminal of DUM and ground. Note that the connection to the oscilloscope is generally a coaxial cable which has its outer conductor grounded, which ground is represented in the drawing by a rectangle 27. Signal generator 16 is also connected to ground.

In the preferred embodiment of exemplary measurement circuit 10, resistor 20 has a value of R, while resistor 21 has the value aR, and resistor 22 has the value of r while resistor 23 has the value ar. In this configuration, the circuit including the operational amplifier 14 and resistors 20–23 forms a variable reference amplifier with a gain of "a". When the signal generator 16 provides an AC output signal with an amplitude of "V", the circuit 10 will apply an AC signal across DUM 12 with an amplitude of "a x V". As long as the signal applied to the DUM 12 is within the voltage and current compliance and operational bandwidth of the operational amplifier 14, the shape and amplitude of the signal applied to the DUM 12 will be maintained with no distortion, regardless of the impedance of the DUM or the voltage across the load capacitor. As long as the impedance of the load capacitor 18 is small compared to the combined impedance of the resistors 22 and 23, the voltage across the load capacitor 18 will be, to a very good approximation, proportional to the charge displaced within the DUM. Thus, in comparison to the prior art measurement circuits, the measurement of the voltage across the load 18 by oscilloscope 26 gives a more accurate measurement of the charge that a signal pulse of predetermined amplitude displaces across the DUM.

Figure 2:
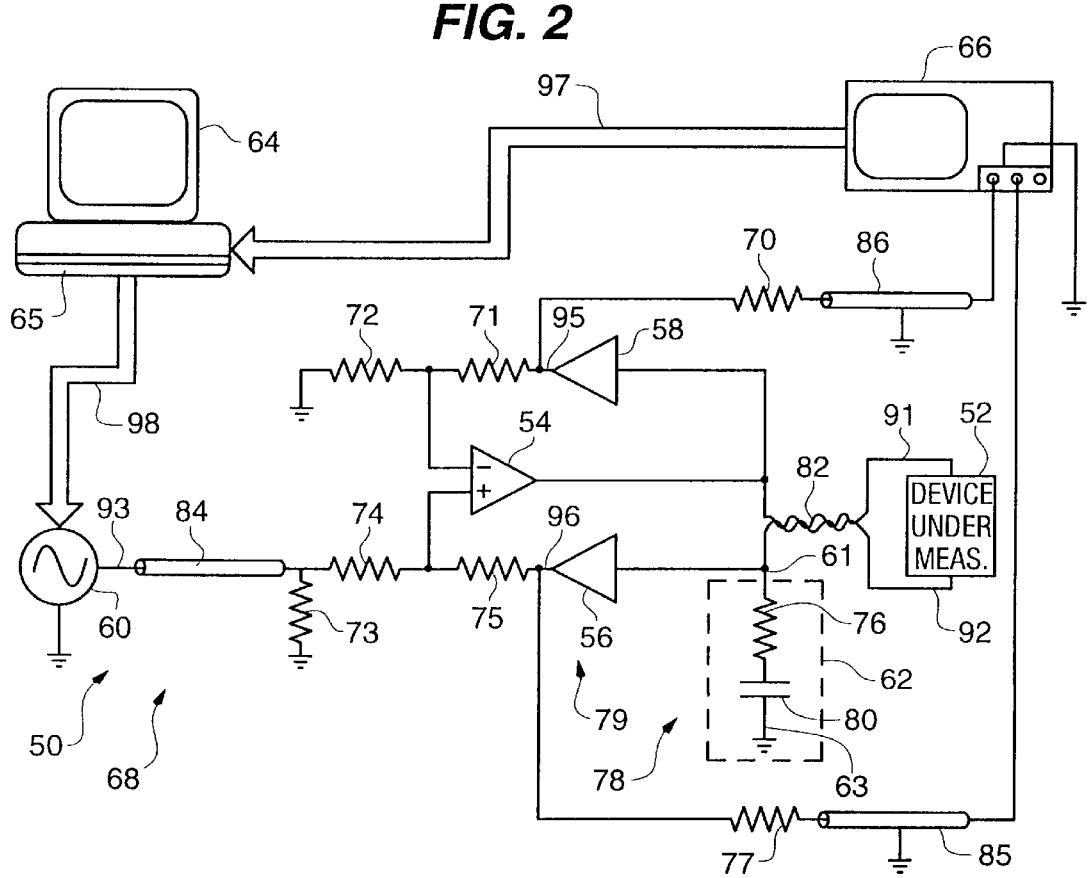
FIG. 2 shows the preferred embodiment of a measurement circuit according to the invention.

FIG. 2 shows the preferred embodiment of a measurement circuit 50 according to the invention. Measurement circuit 50 includes DUM 52, operational amplifier 54, buffer amplifiers 56 and 58, signal generator 60, load 62, resistors 71–75, 50 ohm cables 84–86, and twisted pair 82. The preferred embodiment of circuit 50 also incudes oscilloscope 66, computer 64 and connecting cables 97 and 98. Like circuit 10, circuit 50 includes a resistor 72 having a value "R" connected between ground and the inverting input of operational amplifier 54, a resistor 71 having the value "aR" connected between the inverting input of operational amplifier 54 and the first terminal 91 of DUM 52, a resistor 74 having the value "r" connected between the output 93 of signal generator 60 and the non-inverting input of operational amplifier 54, a resistor 75 having the value "ar" connected between the second terminal 92 of the DUM 52 and the non-inverting input of operational amplifier 54, and a load circuit 62 having its input 61 connected to the second terminal 92 of DUM 52 and its output 63 connected to ground. Thus, the circuit of FIG. 2, is essentially the same as the circuit of FIG. 1, except that it includes buffer amplifier 58 having its input connected to the first terminal 91 of DUM 52 and its output 95 connected to resistor 71, buffer amplifier 56 having its input connected to the second terminal 92 of DUM 52 and its output 96 connected to resistor 75, channel 1 of oscilloscope 66 being connected to the output 95 of buffer 58 via coaxial cable 86 and resistor 70 in series, channel 2 of oscilloscope 66 being connected to the output 96 of buffer 56 via coaxial cable 85 and resistor 77 in series, the output 93 of signal generator 60 being connected to resistor 74 via coaxial cable 84, the node between coaxial cable 84 and resistor 74 being connected to ground through resistor 73, DUM 52 being connected to the rest of circuit 50 via a twisted pair 82, and computer 64 receives the output of oscilloscope 66 via cable 97 and controls the output of signal generator 60 via cable 98. In FIG. 2, load 62 is shown more generally, as a circuit including a resistor 76 and a capacitor 80, although it is understood that it can include just a resistor, just a capacitor, or any other appropriate load circuit, depending on the DUM and the electronic parameter of the DUM to be measured.

Buffer amplifiers 56 and 58 provide proper feedback to the operational amplifier 54 while at the same time preventing current from flowing from the DUM to ground through the buffers, thus ensuring that the only effective path from the DUM to ground is through load 62 and that the current flowing through the load 62 is the same as the current flowing through the DUM 52. The buffer amplifiers 56 and 58 also serve as line drivers for the transmission cables 85 and 86, respectively, carrying signals to the oscilloscope 66. This allows cables 85 and 86 to be properly terminated, eliminating the ringing which occurs at high frequencies as a result of impedance mismatch. Connecting the feedback legs through the buffer amps 56 and 58 also provides short circuit protection. Twisted pair 82 is preferably made of a very fine wire, such as magnet wire. Using such a twisted pair to carry signals to DUM 52 limits any stray inductance which could become problematic at high frequencies. The resistors 70 and 77 essentially create a voltage divider that divides the voltage output by the buffer amplifiers to a level more suitable for input into oscilloscope 66. Computer keyboard 65 is used to input data into a software program that controls signal generator 60 and which receives, displays, and prints out data from oscilloscope 66.

In taking the measurements discussed below, resistors 70 through 75 were 450 ohms, 2.2 Kohms, 1.1 Kohms, 50 ohms, 500 ohms, and 1 Kohms, respectively. Load 62 was a 650 picofarads. That is, "a" was equal to 2, "R" was equal to 1.1 Kohms, and "r" was equal to 500 ohms. The above value of resistor 70 made the input to channel 1 of oscilloscope 66 a 10 to 1 divider and the above value of resistor 77 made the channel 2 input to oscilloscope 66 a 2 to 1 divider. Buffer amplifiers 56 and 58 were BUF04 buffer amplifiers from Analog Devices and operational amplifier 54 was an AD 811 op amp also from Analog Devices. In the embodiment of FIG. 2, signal generator 60 was an HP8115A from Hewlett Packard Company, oscilloscope 66 was an HP54504A also from Hewlett Packard Company, computer 64 was an IBM compatible 486 computer, and cables 97 and 98 were HPIB communication busses, sometimes referred to as GPIB busses or IEEE 488 standard interfaces. Coaxial cables 84, 85 and 86 were standard coaxial cables with a 50 ohm characteristic impedance. Other values of all these components may, of course, be used. For example operational amplifier 54 and buffer amplifiers 56 and 58 may be any other suitable off-the-shelf or custom amplifiers, either of the integrated circuit or discrete variety.

In the measurements discussed below, the DUM was a ferroelectric capacitor, and load element 62 was a 650 picofarad linear capacitor. In the case of the DUM being a ferroelectric capacitor, the load element 62 may be a capacitor, a resistor, or a combination of the two. If only a resistor is used, the voltage across the load resistor is proportional to the current flowing through the DUM 52. The charge can then be calculated by integrating the current with respect to time. If only a load capacitor is used, the voltage across the load capacitor is proportional to the charge flowing through the DUM 52, and the current can be calculated by differentiating the charge with respect to time. If a combination of a capacitor and a resistor, or any other combination of elements are used as a load 62, the displaced charge and current can be calculated from the voltage across the load 62 with mathematical equations known in the art.

By applying an AC voltage signal to DUM 52 and measuring the resultant current within the DUM, the impedance of the DUM as a function of voltage and frequency can be calculated from Ohm's law. Preferably, a resistor is used as the load 62 in such a measurement. By applying a DC bias to the DUM 52, the DC leakage current of the DUM 52 can be measured. By varying the DC voltage, the leakage current as a function of voltage may be obtained. The following electrical parameters of thin film capacitors as a function of voltage and frequency have been measured with the measurement circuit 50 according to the invention: 1) the resistance, capacitance and inductance; 2) the complex dielectric constant; 3) the ferroelectric, paraelectric, and dielectric polarization and current; 4) The time-dependent dielectric breakdown. From the above, it is clear that these and many other electrical parameters may be measured for not only capacitors, but also for a wide variety of other electrical and electronic devices.

Figure 3:
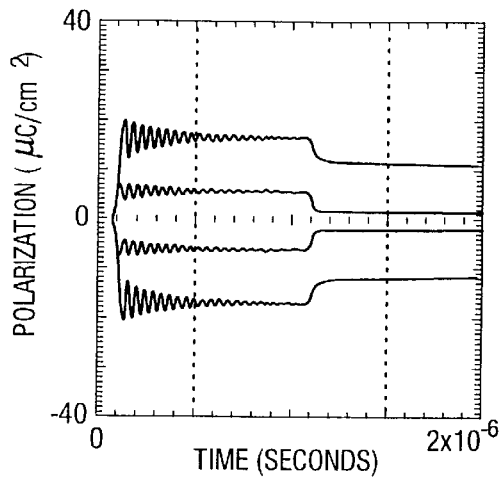
FIG. 3 shows a graph of a polarization in microcoulombs per square centimeter versus the time in seconds for a polarization switching charge measurement made with the prior art Sawyer-Tower circuit.
Figure 4:
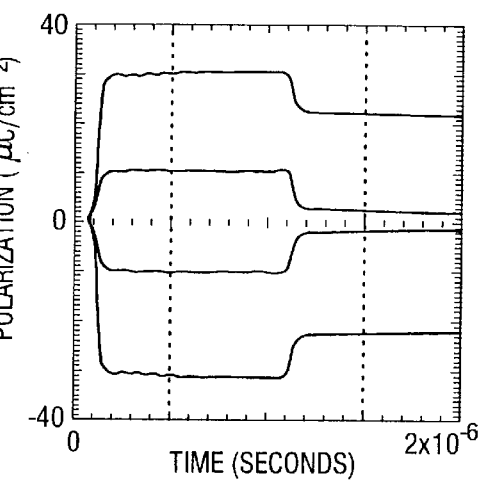
FIG. 4 shows a graph of the polarization in microcoulombs per square centimeter versus the time in seconds for a polarization switching charge measurement made with the measurement circuit of FIG. 2.

FIGS. 3 and 4 compare PUND type measurements of the ferroelectric polarization of a ferroelectric capacitor made with a prior art Sawyer-Tower circuit (FIG. 3) and with the preferred embodiment of the measurement circuit according to the invention (FIG. 4). In both figures the measured ferroelectric polarization in microcoulombs per centimeter squared is plotted as a function of time in seconds. In the measurement performed with the prior art Sawyer-Tower circuit, the measurement oscillates about a maximum that is only about half the measured polarization for the circuit according to the invention. The measurement taken with the circuit of FIG. 2 has no ringing and reveals a polarization that is much higher than that measured with the conventional circuit.

Figure 5:
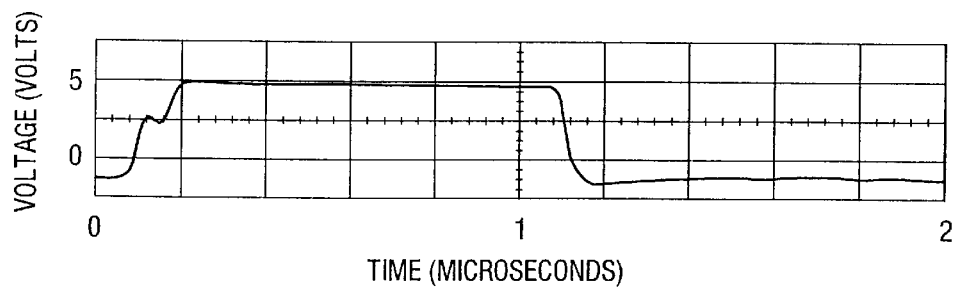
FIG. 5 shows a graph of voltage in volts versus time in microseconds for an input waveform pulse measured for the prior art Sawyer-Tower circuit.
Figure 6:
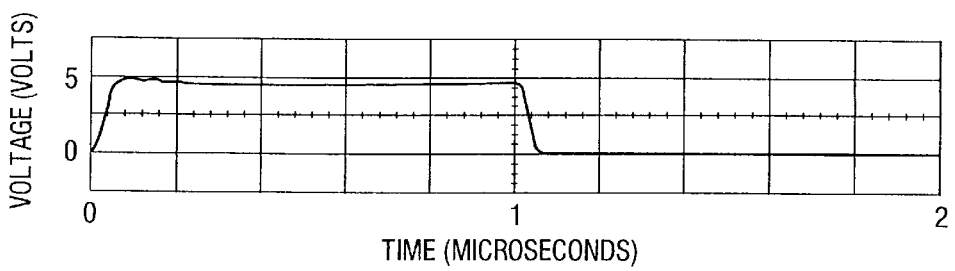
FIG. 6 shows a graph of voltage in volts versus time in microseconds for an input waveform pulse measured for the measurement circuit of FIG. 2.

FIGS. 5 and 6 compare the waveforms input to the DUM for a prior art Sawyer-Tower circuit (FIG. 5) and the measurement circuit of FIG. 2 according to the invention (FIG. 6). In both figures, the input voltage was measured as a function of time in microseconds for a five volt voltage pulse of 1 microsecond duration. (The scales are slightly different in the two figures.) The input pulse for the Sawyer-Tower circuit rises and falls more slowly, includes an oscillation in the rise, and measured pulse length, from the half-rise point to the half-fall point, is not actually one microsecond. The input pulse for the circuit according to the invention is much more square and fits very close to the optimum pulse shape for a 1 microsecond duration pulse.

The circuit 50 may be considered to be the combination of a DUM/load circuit 28, 78, comprising DUM 52 and load 62, and a signal generation circuit 29, 68, comprising signal generator 60, operational amplifier 54 and resistors 71–75. A feature of the invention is that the DUM/load circuit 28, 78 is isolated from the signal generation circuit 29, 68. In circuit 50 the buffers 56, 58, connect the DUM/load circuit 78 from the signal generation circuit 68 thereby preventing current flow through the connection between the DUM/load circuit 78 and the signal generation circuit 68.

It is another feature of the invention that feedback, via feedback circuit 79, is provided from the DUM/load circuit 78 to the signal generation circuit, to enable the signal generation circuit to maintain a predetermined voltage across the DUM.

It is a feature of the invention that the voltage across the load 18, 62 provides the reference voltage into the operational amplifier 14, 54. It is another feature of the invention that the first terminal 34, 91 of the DUM is allowed to float to the voltage that will maintain the desired predetermined voltage across the DUM. That is, the voltage on the second terminal 36, 92 of the DUM is input as a reference voltage to the operational amplifier, and the operational amplifier holds its output at the voltage that will cause the voltage drop across the DUM to be the predetermined voltage. Thus, the measurement of the electrical parameter is always for an accurately known voltage applied across the DUM, and errors due to inaccuracies of the applied voltage are eliminated. The combination of the above two features permits the selection of a load such that the voltage, current, or other load parameter measured will always be much higher than the measurement tolerances, so that the measurements will always be accurate. That is, the load can be selected such that the electrical parameter measurements on it are optimized, knowing that the rest of the circuit will automatically apply the predetermined voltage across the DUM.

It is a further feature of the invention that current that flows from or through the DUM 12, 52 is the same as the current that flows through the load 18, 62. In the circuit of FIG. 1, this is true to a good approximation provided the resistors 22 and 23 and the load are chosen properly. In the circuit of FIG. 2, the buffer amplifiers 56 and 58 ensure that this is true to within the tolerances of the buffer appliers, which generally are extremely small as compared to the inaccuracies of the prior art circuits.

It is a related feature of the invention that the buffer amplifiers control the flow of current to the inputs of the operational amplifier. Thus, any offset current that derives from the portion of the circuit 50 including the DUM 52 and load 62 is virtually eliminated.

There has been described novel apparatus and methods for measuring the current, charge, and other electronic parameters in response to an applied voltage. It should be understood that the particular embodiments shown in the drawings and described within this specification are for purposes of example and should not be construed to limit the invention which will be described in the claims below. Further, it is evident that those skilled in the art may now make numerous uses and modifications of the specific embodiment described, without departing from the inventive concepts. For example, now that the advantage of a circuit, such as an operational amplifier, that assures that a predetermined voltage is applied across the DUM and that the current through the DUM is the same as the current through the load, other such circuits may be devised. A wide variety of load elements or circuits may be used. Further, the apparatus and methods of the invention may be combined with other electronic elements and process steps to provide variations on the apparatus and methods described. Or equivalent circuits and process may be substituted for the various circuits and processes described. Consequently, the invention is to be construed as embracing each and every novel feature and novel combination of features present in and/or possessed by the measurement apparatus and methods described.

We claim:

1. An electrical measurement circuit comprising:
 a first electrical terminal for connection to a device upon which the measurement of an electronic parameter is to be performed (DUM);

a second electrical terminal for connection to said DUM;

a load circuit having a load circuit input and a load circuit output;

a signal generation circuit including an operational amplifier having a first input, a second input and an output; and an electrical connection element for connection to an electrical measurement device;

wherein said second terminal is connected to said load circuit input and to one of said inputs of said operational amplifier; said first electrical terminal is connected to said output of said operational amplifier and the other of said inputs of said operational amplifier; and said electrical connection element is electrically connected to at least one of said terminals.

2. An electrical measurement circuit as in claim 1 wherein said load circuit includes a ground and wherein said load circuit output is connected to said ground.

3. An electrical measurement circuit as in claim 1 wherein said first input of said operational amplifier is a non-inverting input and said second input of said operational amplifier is an inverting input, said second terminal is connected to said non-inverting input, and said first terminal is connected to said inverting input.

4. An electrical measurement circuit as in claim 3 wherein said signal generation circuit includes a signal generator connected to said non-inverting input and said electrical measurement device includes an oscilloscope connected to said second terminal via said electrical connection element.

5. An electrical measurement circuit as in claim 4 wherein said signal generation circuit further includes a first resistor connected between said inverting input and said ground, a second resistor connected between said inverting input and said first terminal, a third resistor connected between said signal generator and said non-inverting input, and a fourth resistor connected between said non-inverting input and said second terminal.

6. An electrical measurement circuit as in claim 1, said electrical measurement circuit further comprising a first buffer amplifier connected between said second terminal and said one of said inputs of said operational amplifier, thereby preventing current flow through said connection between said second terminal and said operational amplifier.

7. An electrical measurement circuit as in claim 6 wherein said first buffer amplifier includes a first buffer amplifier input and a first buffer amplifier output, said first input of said operational amplifier is an inverting input and said second input of said operational amplifier is a non-inverting input, said second terminal is connected to said first buffer amplifier input, and said first buffer amplifier output is connected to said non-inverting input.

8. An electrical measurement circuit as in claim 7 and further including a second buffer amplifier having a second buffer amplifier input and a second buffer amplifier output and said electrical measurement device comprises an oscilloscope, said second buffer amplifier input is connected to said first electrical terminal and said oscilloscope is connected between said electrical connection element and said output of said second buffer amplifier.

9. An electrical measurement circuit as in claim 8, including a ground, and wherein said signal generation circuit includes a signal generator, a first resistor connected between said inverting input and said ground, a second resistor connected between said output of said second buffer amplifier and said inverting input, a third resistor connected between said signal generator and said non-inverting input, and a fourth resistor connected between the output of said first buffer amplifier and said non-inverting input.

10. An electrical measurement circuit as in claim 9 and further including a computer connected between said oscilloscope and said signal generator.

11. An electrical measurement circuit comprising:

a first electrical terminal for connection to a device upon which the measurement of an electronic parameter is to be performed (DUM);

a second electrical terminal for connection to said DUM;

a ground, a first resistor, a second resistor, a third resistor, and a fourth resistor;

a signal generator;

an operational amplifier having an inverting input, a non-inverting input, and an output;

said first terminal connected to said operational amplifier output, and said first terminal also connected to said inverting input through said first resistor;

said inverting input also connected to said ground through said second resistor;

said signal generator connected to said non-inverting input through said third resistor; and said second terminal connected to said non-inverting input through said fourth resistor.

12. An electrical measurement circuit as in claim 11 and further including a first buffer amplifier and a second buffer amplifier, and wherein said first buffer amplifier is connected between said first terminal said first resistor, and said second buffer amplifier is connected between said second terminal and said fourth resistor.

* * * * *